United States Patent
Honda et al.

(10) Patent No.: US 8,241,514 B2
(45) Date of Patent: Aug. 14, 2012

(54) PLASMA ETCHING METHOD AND COMPUTER READABLE STORAGE MEDIUM

(75) Inventors: Masanobu Honda, Nirasaki (JP); Hiroyuki Nakayama, Nirasaki (JP); Manabu Sato, Boise, ID (US)

(73) Assignee: Tokyo Electron Limited, Tokyo (JP)

( * ) Notice: Subject to any disclaimer, the term of this patent is extended or adjusted under 35 U.S.C. 154(b) by 695 days.

(21) Appl. No.: 12/413,999

(22) Filed: Mar. 30, 2009

(65) Prior Publication Data

US 2009/0242516 A1 Oct. 1, 2009

Related U.S. Application Data

(60) Provisional application No. 61/109,980, filed on Oct. 31, 2008.

(30) Foreign Application Priority Data

Mar. 31, 2008 (JP) .................. 2008-092002

(51) Int. Cl.
*B44C 1/22* (2006.01)
*C03C 15/00* (2006.01)
*C03C 25/68* (2006.01)
*C23F 1/00* (2006.01)

(52) U.S. Cl. .............. 216/71; 216/67; 438/714

(58) Field of Classification Search ............ 216/71, 216/67; 438/714
See application file for complete search history.

(56) References Cited

U.S. PATENT DOCUMENTS

| 5,501,893 | A | 3/1996 | Laermer et al. |
| 2006/0037701 | A1* | 2/2006 | Koshiishi et al. ........ 156/345.44 |
| 2006/0219363 | A1 | 10/2006 | Matsumoto et al. |
| 2007/0165355 | A1 | 7/2007 | Sato et al. |
| 2007/0218681 | A1 | 9/2007 | Yoshida |

FOREIGN PATENT DOCUMENTS

| JP | 7-503815 | 4/1995 |
| KR | 10-2006-0071511 | 6/2006 |
| KR | 10-2006-0105670 | 10/2006 |
| KR | 10-2007-0070098 | 7/2007 |
| KR | 10-2007-0094476 | 9/2007 |

OTHER PUBLICATIONS

Korean Office Action issued Jan. 21, 2011, in Patent Application No. 10-2009-0027704 (with English-language translation).

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

A plasma etching method includes disposing a first electrode and a second electrode to face each other; preparing a part in the processing chamber; supporting a substrate; vacuum-evacuating the processing chamber; supplying an etching gas into a processing space between the first electrode and the second electrode; generating a plasma of the etching gas in the processing space by applying a radio wave power to the first electrode or the second electrode; and etching a film to be processed on a surface of the substrate by using the plasma. Further, a DC voltage is applied to the part during the etching process, the part being disposed away from the substrate and being etched by reaction with reactant species in the plasma.

20 Claims, 8 Drawing Sheets

PLASMA ETCHING METHOD AND COMPUTER READABLE STORAGE MEDIUM

FIELD OF THE INVENTION

The present invention relates to a plasma etching method for performing a dry etching process on a substrate to be processed by using a plasma and a computer readable storage medium storing a program for executing the plasma etching method.

BACKGROUND OF THE INVENTION

In an etching process of a manufacturing process of a semiconductor device or a flat panel display (FPD), a film on a surface of a substrate to be processed (a semiconductor wafer, a glass substrate or the like) is processed in a desired circuit pattern by using as a mask a resist pattern formed by a lithography technique. Conventionally, a capacitively coupled plasma etching apparatus has been widely used for single-wafer etching.

Generally, in a capacitively coupled plasma etching apparatus, an upper electrode and a lower electrode are arranged in parallel in a vacuum processing, and a substrate to be processed is mounted on the lower electrode. By applying a radio wave power between the electrodes, a radio wave electric field is generated between the electrodes. Then, molecules of a processing gas are ionized by collision with electrons accelerated by the radio wave electric field, electrons emitted from the electrodes, or heated electrons, thereby generating a plasma of the processing gas. Accordingly, desired micromachining, e.g., etching, can be performed on a surface of the substrate by radicals or ions in the plasma.

As the size of semiconductor device is scaled down, a requirement for a shape and a dimensional accuracy in plasma etching becomes stricter. Conventionally, a film deposited or formed on a sidewall of a resist or a pattern during an etching process is used as a so-called sidewall protection film to control an etched cross sectional shape. When a deposition rate is high, the sidewall of pattern is protected from neutral reactive species or ion impact, so that an undercut or a bowing hardly occurs. If the deposition rate is too high, an etching rate decreases. This may cause an excessively tapered shape or even results in the stop of etching reaction. In addition, as the etching time increases, the resist may be deteriorated of consumed a lot, resulting in the dimensional inaccuracy.

Therefore, in order to improve accuracy of anisotropic processing by preventing generation of undesired bow or taper shape, it is required to properly combine an etching dominant process and a deposition dominant process. For that reason, conventionally, there is employed a multi-step method, wherein a single continuous etching process is divided into a plurality of steps in accordance with the chemistry of an etching gas, such that the etching dominant step, in which an etchant gas for enhancing etching is supplied into the chamber, and the deposition dominant step, in which an etchant gas for facilitating deposition is supplied into the chamber are carried out sequentially.

However, the conventional multi-step method in which different etching gases are used in a plurality of steps requires a plurality of gas supply sources, so that the etching apparatus is scaled up. Further, transition between the etching dominant step and the deposition dominant step is stepwise and discontinuous. As a consequence, a stepped portion may be generated on the pattern sidewall, and it is difficult to control a desired etching shape accurately.

SUMMARY OF THE INVENTION

In view of the above, the present invention provides a plasma etching method capable of controlling a desired etching shape accurately by using a capacitively coupled plasma etching apparatus, and a computer readable storage medium storing therein a program for performing the method.

In accordance with one aspect of the invention, there is provided a plasma etching method including: disposing a first electrode and a second electrode to face each other in parallel with a gap therebetween in a vacuum evacuable processing chamber; preparing a part in the processing chamber; supporting a substrate to be processed by the second electrode to face the first electrode; vacuum-evacuating the processing chamber to a predetermined pressure; supplying an etching gas into a processing space between the first electrode and the second electrode; generating a plasma of the etching gas in the processing space by applying a radio wave power to the first electrode or the second electrode; and etching a film to be processed on a surface of the substrate by using the plasma.

Further, a DC voltage is applied to the part during a predetermined etching process, the part being disposed away from the substrate and being etched by reaction with reactant species in the plasma. Moreover, the DC voltage is varied on a time axis in accordance with a preset time-voltage function to thereby obtain desired etching characteristics with respect to the film, during the etching process, at least process parameters related to the etching gas are not varied.

During the etching process, the film to be processed on the surface of the substrate in the processing chamber and the surface of the DC voltage application member are etched by the same plasma, so that the reactant species in the plasma are consumed on both surfaces. In the present invention, the consumption amount of the reactant species on the surface of the DC application member varies e.g., continuously by varying a DC voltage applied to the DC application member on a time axis in accordance with a preset time-voltage function. As a consequence, etching characteristics (e.g., an etching rate) of the film to be processed vary continuously. As a consequence, the relationship between the etching facilitating process and the deposition facilitating process can be variably controlled continuously (analogously) and at a high speed while maintaining types and flow rates of the etching gases during the one-step etching process and, further, the desired etching shape can be controlled accurately.

When the DC voltage applied to the DC voltage application member varies within a negative value range, as an absolute value thereof increases, an ion assist effect increases, thereby facilitating the etching reaction (i.e., consumption of reactance species) on the surface of the DC voltage application member. It is preferred that the DC voltage varies within a negative value range, and an absolute value of the DC voltage decreases when an etching rate of the film is required to be increased, and increases when the etching rate of the film is required to be decreased during the etching process. Further, the DC voltage varies within a negative value range, and an absolute value of the DC voltage increases when a deposition with respect to the film is required to be enhanced, and decreases when the deposition with respect to the film is required to be decreased during the etching process.

In accordance with another aspect of the invention, there is provided a plasma etching method including: disposing a first electrode and a second electrode to face each other in parallel with a predetermined gap therebetween in a vacuum evacuable processing chamber; preparing a part in the processing chamber; supporting a substrate to be processed by the second electrode to face the first electrode; vacuum-evacuating the processing chamber to a predetermined pressure; supplying an etching gas into a processing space between the first electrode and the second electrode; generating a plasma of the etching gas in the processing space by applying a radio wave power to the first electrode or the second electrode; and etching a film to be processed on a surface of the substrate by using the plasma.

Further, a DC voltage is applied to the part during a predetermined etching process, the part being disposed away from the substrate and being etched by reaction with reactant species in the plasma. Moreover, the DC voltage is switched between a first voltage value and a second voltage value on a time axis in each of regular cycles in accordance with a preset time-duty function to thereby obtain desired etching characteristics with respect to the film and, during the etching process, at least process parameters related to the etching gas are not varied.

In the present invention, even by employing the above-described method in which a DC voltage applied to the DC application member is switched between the first voltage value and the second voltage value at regular cycles on a time axis in accordance with a preset time-duty function, the relationship between the etching facilitating process and the deposition facilitating process can be variably controlled substantially continuously and at a high speed while maintaining types and flow rates of the etching gases during the one-step etching process and, further, the desired etching shape can be controlled accurately. Further, this method is advantageous in that a DC voltage regulator can be used.

When the DC voltage applied to the DC voltage application member varies within a negative value range, as an absolute value thereof and a duty increase, an ion assist effect increases, thus facilitating the etching reaction (i.e., consumption of reactance species) on the surface of the DC voltage application member.

It is preferred that the first and the second voltage value have negative values; an absolute value of the first voltage value is larger than an absolute value of the second voltage value; and during the etching process, a duty of a period at which the DC voltage has the first voltage value is decreased when an etching rate for the film is required to be increased, whereas the duty of the period at which the DC voltage has the first voltage value is increased when the etching rate for the film is required to be decreased.

Further, the first and the second voltage value have negative values; an absolute value of the first voltage value is larger than an absolute value of the second voltage value; and during said etching film, a duty of a period at which the DC voltage has the first voltage value is increased when a deposition with respect to the film is required to be enhanced, whereas the duty of the period at which the DC voltage has the first voltage value is decreased when the deposition with respect to the film is required to be decreased.

Preferably, the part to which the DC voltage is applied is the first electrode. Further, the part to which the DC voltage is applied may be a focus ring disposed on the second electrode to surround the substrate annularly.

It is preferred that the part contains silicon, and the etching gas contains a fluorocarbon gas. The present invention can be applied to an application using an etchant gas other than a fluorocarbon gas. In that case, the DC voltage application member may be made of a material that is etched by reactant species of the corresponding etchant gas.

The present invention is especially suitable for an anisotropic etching process. Preferably, an additional radio wave power for attracting ions in the plasma to the substrate is applied to the second electrode.

In accordance with still another aspect of the invention, there is provided a computer readable storage medium storing therein a control program operating on a computer, wherein the control program, when executed, controls a plasma processing apparatus to perform the plasma etching method described above.

BRIEF DESCRIPTION OF THE DRAWINGS

The other objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

Figure 1:
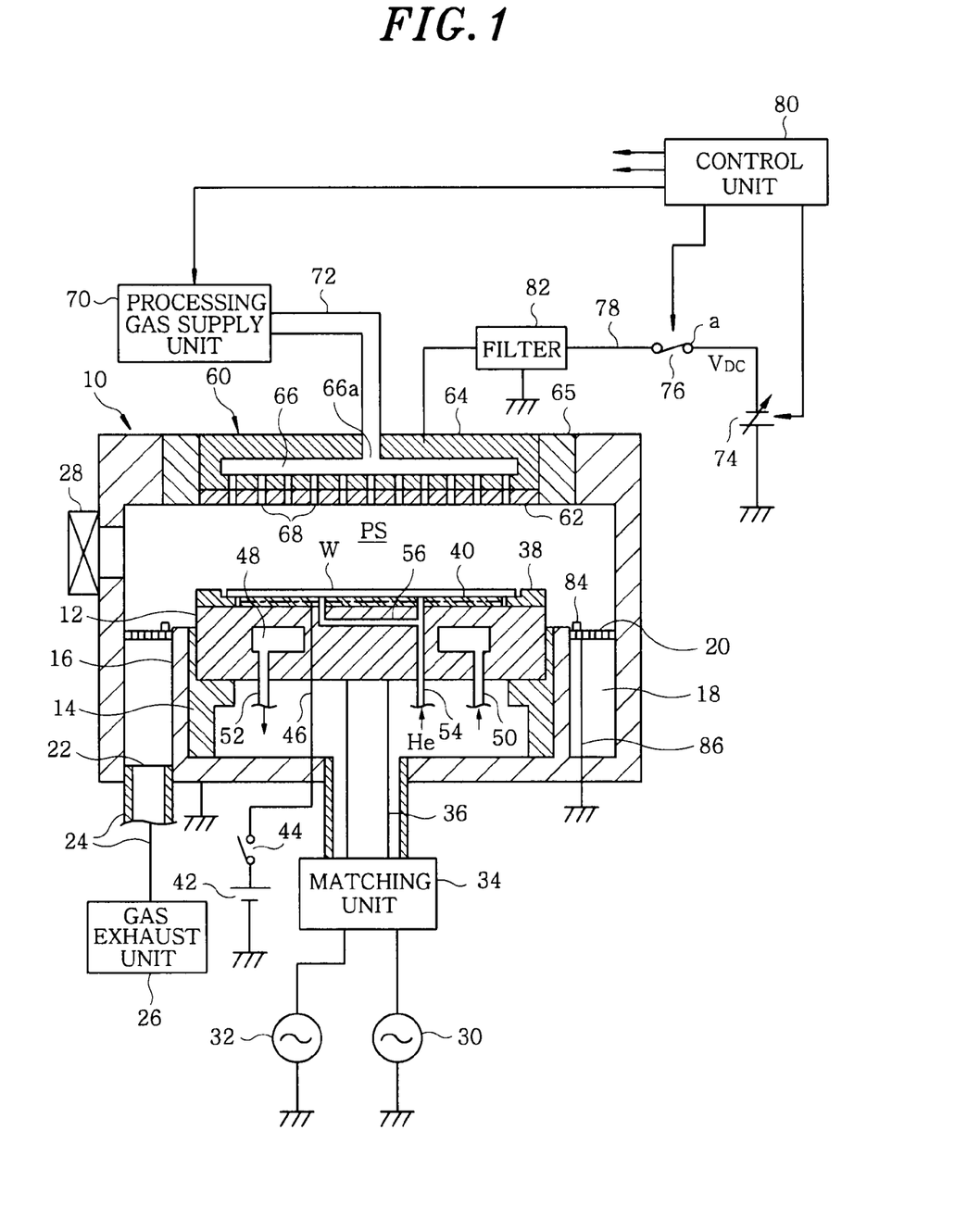
FIG. 1 is a cross sectional view showing a configuration of a capacitively coupled plasma etching apparatus used in a plasma etching method in accordance with an embodiment of the present invention.

FIG. 1 shows a configuration of a plasma processing apparatus used in a plasma etching method of the present invention. This plasma processing apparatus is configured as a cathode coupled capacitively coupled plasma etching apparatus of a lower electrode dual frequency application type, and has a cylindrical chamber (processing vessel) 10 made of metal, e.g., aluminum, stainless steel or the like. The chamber 10 is frame grounded.

A circular plate-shaped susceptor 12 for mounting thereon a substrate to be processed, e.g., a semiconductor wafer W, is horizontally disposed inside the chamber 10 and serves as a lower electrode. The susceptor 12 is made of, e.g., aluminum, and is supported by an insulating cylindrical support portion 14 extending vertically upward from a bottom portion of the chamber 10. An annular gas exhaust passageway 18 is formed between a conductive cylindrical supporting portion (inner wall portion) 16 extending upward from the bottom portion of the chamber 10 along an outer periphery of the cylindrical support portion 14 and a sidewall of the chamber 10. A ring-shaped baffle plate (gas exhaust ring) 20 is attached to an entrance of the gas exhaust passageway 18. A gas exhaust port 22 is disposed on the bottom portion of the gas exhaust passageway 18, and is connected to a gas exhaust unit 26 via a gas exhaust line 24. The gas exhaust unit 26 has a vacuum pump such as a turbo molecular pump or the like, so that a processing space inside the chamber 10 can be depressurized to a desired vacuum level. Attached to a sidewall of the chamber 10 is a gate valve 28 for opening and closing a loading/unloading port for the semiconductor wafer W.

A first and a second radio wave power supply 30 and 32 are electrically connected to the susceptor 12 via a matching unit 34 and a power feed rod 36. Here, the first radio wave power supply 30 outputs a first radio wave power of a frequency (generally greater than or equal to about 40 MHz) which contributes to the plasma generation. The second radio wave power supply 32 outputs a second radio wave of a frequency (generally lower than or equal to about 13.56 MHz) which contribute to the ion attraction to the semiconductor wafer W on the susceptor 12. The matching unit 34 accommodates therein a first matching device for performing matching between an impedance of the first radio wave power supply 30 side and an impedance of a load (mainly, electrode, plasma and chamber) side and a second matching device for performing matching between an impedance of the second radio wave power 32 side and an impedance of the load side.

The susceptor 12 has a larger diameter than that of a semiconductor wafer W to be processed, which is mounted above the susceptor 12, and a focus ring (calibration ring) 38 is disposed to surround the semiconductor wafer W.

An electrostatic chuck 40 for adsorbing a wafer is disposed on a top surface of the susceptor 12. The electrostatic chuck 40 has a structure in which a sheet-shaped or a mesh-shaped conductor is embedded in a film-shaped or a plate-shaped dielectric material. A DC power supply 42 provided outside the chamber 10 is electrically connected to the conductor via a switch 44 and a feeder line 46. The semiconductor wafer W can be adsorptively held on the electrostatic chuck 40 by Coulomb force generated by a DC voltage applied from the DC power supply 42.

An annular coolant path 48 extending, e.g., in a circumferential direction, is provided inside the susceptor 12. A coolant, e.g., cooling water of a specific temperature, flows in the coolant path 48 from a chiller unit (not shown) via a line 50, and flows out via a line 52. Accordingly, the temperature of the semiconductor wafer W on the electrostatic chuck 40 can be controlled by adjusting a temperature of the coolant. Further, in order to further improve accuracy of the temperature control of the wafer, a heat transfer gas, e.g., He gas, is supplied between the electrostatic chuck 40 and the semiconductor wafer W from a heat transfer gas supply unit (not shown) via a gas supply line 54 and a gas passageway 56 inside the susceptor 12.

An upper electrode 60 facing the susceptor 12 in parallel is provided at a ceiling portion of the chamber 10, the upper electrode 60 serving as a shower head. The upper electrode 60 includes an electrode plate 62 facing the susceptor 12; and an electrode supporting member 64 for supporting the electrode plate 62 in an attachable and detachable manner from the rear (top) surface thereof. The electrode supporting member 64 has therein a gas diffusion space 66, and a plurality of gas discharge openings 68 extending from the gas diffusion space 66 to the susceptor 12 are formed in the electrode supporting member 64 and the electrode plate 62. A space between the electrode plate 62 and the susceptor 12 serves as a plasma generation space or a processing space PS. A gas inlet 66a provided at an upper portion of the gas diffusion space 66 is connected with a gas supply line 72 from a processing gas supply unit 70.

A material of the electrode plate 62 exposed to a plasma during processing plays an important role in the upper electrode 60. In this embodiment, it is preferable to use a material that is etched by reaction with reactant species in the plasma. For example, when a CF-based gas, i.e., a fluorocarbon gas, is used as an etching gas, the electrode plate 62 is preferably made of a Si-containing conductive material such as Si, SiC or the like. The electrode supporting member 64 may be made of, e.g., alumite-treated aluminum. A ring-shaped insulator 65 is inserted between the upper electrode 60 and the chamber 10, so that the upper electrode 60 is attached to the chamber 10 in a state electrically isolated therefrom.

An output terminal of a variable DC power supply 74 installed outside the chamber 10 is electrically connected to the upper electrode 60 via an on/off switch 76 and a DC power supply line 78. The variable DC power supply 74 is configured to output a variable DC voltage $V_{DC}$ ranging from, e.g., about −2000 to about +1000 V under the control of a control unit 80.

A filter circuit 82 provided in the middle of the DC power supply line 78 is configured to allow a DC voltage $V_{DC}$ from the variable DC power supply 74 to pass therethrough and to be applied to the upper electrode 60. The filter circuit 82 is also configured to allow a radio wave supplied from the susceptor 12 to the DC power supply line 78 via the processing space PS and the upper electrode 60 to flow toward a ground line without letting it flow toward the variable DC power supply 74.

Further, a ring-shaped DC ground member (DC ground electrode) 84 made of a conductive material, e.g., Si, SiC or the like, is attached to a portion facing the processing space PS in the chamber 10, e.g., a top surface of the baffle plate 20, the vicinity of a top portion of the supporting member 16 or a radially outer portion of the upper electrode 60. This ring-shaped DC ground member 84 is constantly grounded via a ground line 86. When the DC voltage $V_{DC}$ is applied from the variable DC power supply 74 to the upper electrode 60 during the plasma etching, a DC current flows between the upper electrode 60 and the DC ground member 84 via the plasma.

The control unit 80 includes a microcomputer, and controls an entire operation (sequence) of the apparatus and independently controls an operation of each unit in the apparatus, especially the gas exhaust unit 26, the radio wave power supplies 30 and 32, the matching unit 34, the switch for electrostatic chuck 44, the processing gas supply unit 70, the variable DC power supply 74, the on/off switch 76 and the like, in accordance with recipe information and software (program) stored in an external memory or in an internal memory.

In this plasma etching apparatus, in order to perform the etching, first of all, the semiconductor wafer W to be processed is loaded into the chamber 10 while opening the gate valve 28 and then is mounted on the electrostatic chuck 40. Further, an etching gas (generally, a gaseous mixture) is introduced into the chamber 10 at a predetermined flow rate from the processing gas supply unit 70, and a pressure inside the chamber 10 is set to a predetermined level by using the gas exhaust unit 26. Moreover, by turning on the first and the second radio wave power supplies 30 and 32, the first radio wave (greater than or equal to 40 MHz) and the second radio wave (smaller than or equal to 13.56 MHz) are output at predetermined power levels, respectively. These high frequencies are supplied to the susceptor 12 via the matching unit 34 and the power feed rod 36. Furthermore, by turning on the switch 44, an electrostatic force attracts the semiconductor wafer W to the electrostatic chuck 40, thereby confining a heat transfer gas (He gas) in a contact interface between the electrostatic chuck 40 and the semiconductor wafer W. The etching gas discharged from the upper electrode 60 is converted into a plasma between both electrodes 12 and 60 by a high frequency discharge, and a film to be processed on the surface of the semiconductor wafer W is etched by radicals or ions generated from the plasma.

In this capacitively coupled plasma etching apparatus, by applying to the susceptor 12 a comparatively higher first radio wave higher than or equal to 40 MHz which is suitable for plasma generation, it is possible to form a plasma of high density in a desired dissociation state and, hence, a high-density plasma can be obtained even under the lower pressure condition. At the same time, a comparatively lower second radio wave lower than or equal to 13.56 MHz which is suitable for ion attraction is applied to the susceptor 12, so that highly anisotropic etching with high selectivity can be performed on the film to be processed on the semiconductor wafer W. Although the first radio wave for plasma generation is required to be used in any plasma process, the second radio wave for ion attraction may not be used depending on the processes.

The capacitively coupled plasma etching apparatus of the lower electrode dual frequency application type is configured to apply a variable DC voltage $V_{DC}$ from the variable DC power supply 74 to the upper electrode 60. When the DC voltage $V_{DC}$ is applied to the upper electrode 60 during the plasma etching, the etching characteristics on the semiconductor wafer W are affected by interaction among a polarity and an absolute value of the DC voltage $V_{DC}$, types and flow rates of gases, a plasma state, structures and materials of the chamber and the electrode, and the like.

Figure 2:
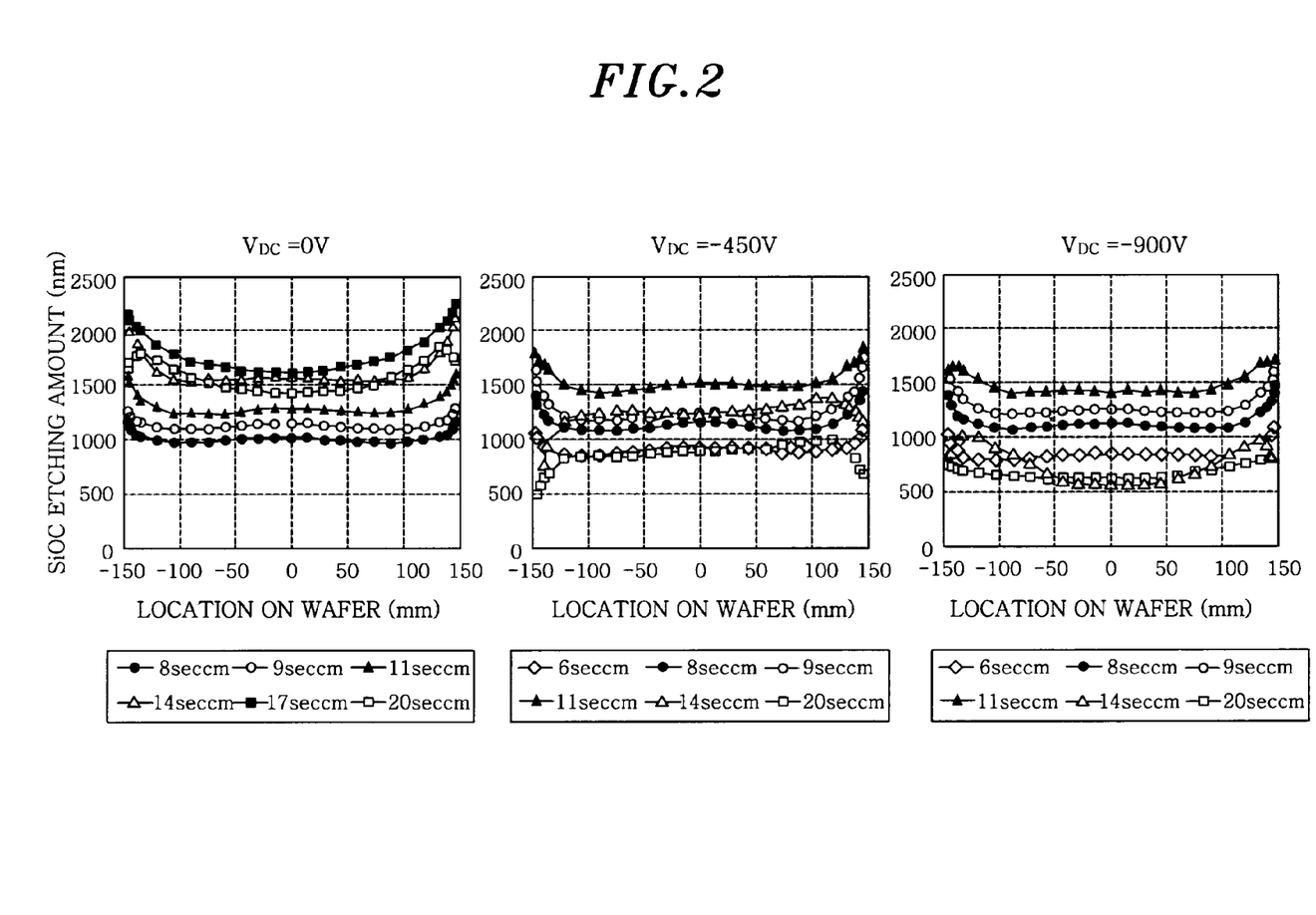
FIG. 2 is a graph showing etching rate distribution characteristics obtained by etching a blanket SiOC film and a blanket SiN film in the above embodiment.

FIG. 2 shows etching amount distribution characteristics on the wafer which were obtained by etching a blanket SiOC film by using the plasma etching apparatus of the present embodiment while setting the DC voltage $V_{DC}$ applied to the upper electrode 60 as 0 V, −450 V and −900 V and varying a flow rate M (sccm) of a fluorocarbon gas contained in the etching gas (gaseous mixture) among six levels at the respective DC voltage levels. Main etching conditions were as follows;

Wafer diameter: 300 mm,
Etching gas: $C_4F_8/Ar/N_2$=M/1000/150 sccm,
Pressure in the chamber: 50 mTorr,
Radio wave power: 40/2 MHz=1500/0 W,
Temperature: upper electrode/chamber sidewall/lower electrode=60/60/20° C.,
Etching time: 30 seconds.

Referring to FIG. 2, in the case where $V_{DC}$ is 0 V, an etching rate (E/R) of SiOC is highest when a $C_4F_8$ flow rate M is about 17 sccm, and is slightly lower than the highest when M is about 20 sccm. In the case where $V_{DC}$ is −450 V, an E/R is highest when a $C_4F_8$ flow rate M is about 11 sccm, and is considerably lower than the highest when M is about 14 sccm. In the case where $V_{DC}$ is −900 V, an E/R is highest when a $C_4F_8$ flow rate M is about 11 sccm, and is remarkably lower than the highest value when M is about 14 sccm.

Figure 3:
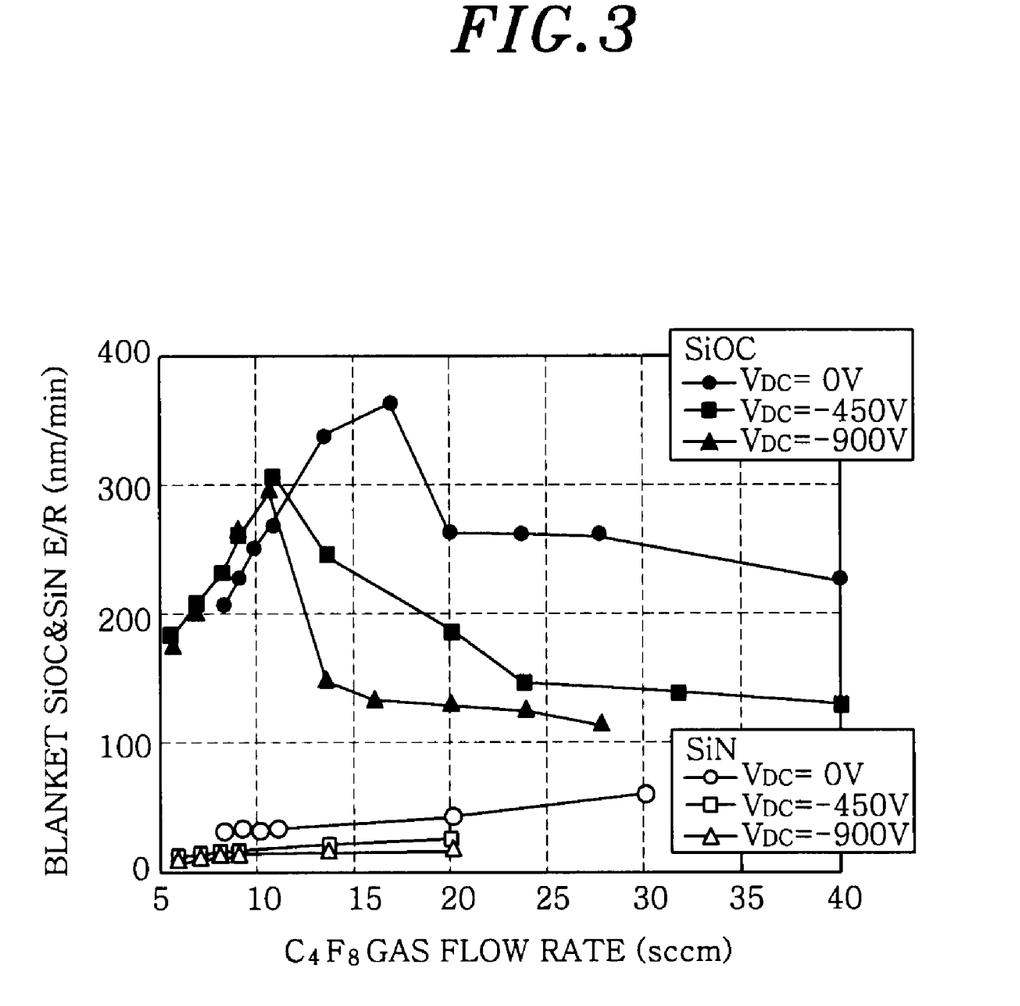
FIG. 3 provides a graph illustrating a relationship between a flow rate of a fluorocarbon gas and an etching rate of SiOC which is obtained by using, as a parameter, a DC voltage to be applied to an upper electrode.

FIG. 3 is a graph showing a relationship between a $C_4F_8$ flow rate and an average value of E/R of SiOC which was obtained when $V_{DC}$ was changed among 0 V, −450 V and −900 V. Referring to the graph of FIG. 3, in the case where the $C_4F_8$ flow rate ranges from about 14 to 18 sccm, an E/R is about 300 to 360 nm/min when $V_{DC}$ is 0 V, about 200 to 240 nm/min when $V_{DC}$ is −450 V, and about 130 to 150 nm/min when $V_{DC}$ is −900V. Namely, an E/R of SiOC largely varies depending on a value of $V_{DC}$. Therefore, it was found that, in this flow rate range, an E/R of SiOC can be dynamically varied a lot by using $V_{DC}$ as a parameter.

Figure 4:
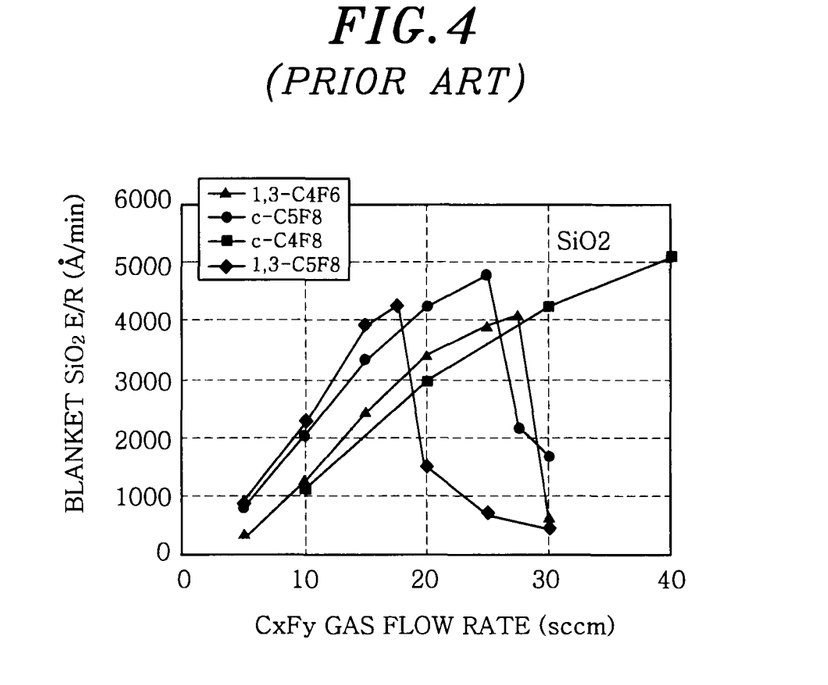
FIG. 4 is a graph presenting a relationship between a flow rate of a $C_xF_y$ gas and an etching rate (E/R) which is obtained by etching a blanket $SiO_2$ film by a conventional method.

FIG. 4 is a graph illustrating a relationship between a fluorocarbon gas ($C_XF_Y$) flow rate and an etching rate (E/R) of $SiO_2$ which was obtained by etching a blanket $SiO_2$ film by using the plasma etching apparatus of the present embodiment without applying a DC voltage $V_{DC}$ to the upper electrode 60. At this time, the $C_XF_Y$ gas contained in the etching gas was selected among 1,3-$C_4F_6$, c-$C_5F_8$, c-$C_4F_8$, and 1,3-$C_5F_8$.

Referring to the graph of FIG. 4, it can be seen that when the $C_XF_Y$ gas flow rate is about 30 sccm, an E/R largely varies depending on types of the $C_XF_Y$ gas. Namely, the E/R varies by several times depending on whether the $C_XF_Y$ gas is c-$C_4F_8$ having a strong etching characteristic or c-$C_5F_8$, 1,3-$C_5F_8$ or 1,3-$C_4F_6$ having a strong deposition characteristic. A conventional multi-step method sequentially combines a step of using c-$C_4F_8$ gas having a strong etching characteristic and a step of using c-$C_5F_8$, 1,3-$C_5F_8$ or 1,3-$C_4F_6$ having a strong deposition characteristic based on the above-described characteristics.

Here, it should be noted that the graph of FIG. 3 is very similar to that of FIG. 4. These graphs show the equivalence and the difference between the conventional multi-step method and the method of the present embodiment. In order to vary an E/R, the conventional multi-step method changes gas types, whereas the method of the present embodiment varies a value of a DC voltage $V_{DC}$ applied to the upper electrode 60.

The conventional multi-step method and the present embodiment are equivalent in that both can have similar processing results (etching rate variations), but are quite different in their effects due to the different processes. Namely, in the multi-step method, conversion between the etching facilitating process and the deposition facilitating process is performed stepwise, and considerable time is required for gas change during the conversion. On the other hand, the present embodiment can variably and arbitrarily control the degree of predominance in the relationship between the etching facilitating process and the deposition facilitating process continuously (analogously) and rapidly by continuously changing a value of the DC voltage $V_{DC}$.

In the plasma etching apparatus of the present embodiment, the $C_XF_Y$ gas is decomposed by a high frequency discharge of an etching gas, thereby generating reactant species such as F atoms, $CF_3$ and the like. The reactant species thus generated react with a film to be processed on the surface of the semiconductor wafer W. Accordingly, a volatile product (e.g., $SiF_4$) is generated, and a polymerized film (e.g., $(CF_2)_n$) is deposited. When the electrode plate 62 of the upper electrode 60 is made of a Si-containing conductive material, the same reaction occurs on the surface of the electrode plate 62 as well as on the surface of the semiconductor wafer W, and the reactant species are consumed on both surfaces. Here, if a negative DC voltage $V_{DC}$ ($\leqq 0$ V) is applied to the upper electrode 60, an ion assist effect operates, thereby enhancing the etching reaction (i.e., the consumption of the reactant species) on the surface of the electrode plate 62 and generating a large amount of C-rich $CF_X$. As a result, the etching rate on the surface of the semiconductor wafer W decreases, so that the deposition rate increases. As an absolute value $|V_{DC}|$ of the negative DC voltage $V_{DC}$ increases, the ion assist effect on the surface of the electrode plate 62 increases and, also, the reduction of the etching rate and the increase of the deposition rate on the surface of the semiconductor wafer W are enhanced.

In the plasma etching, etching selectivity against a pattern mask or a base layer as well as an etching rate is an important etching characteristic. FIG. 3 also shows E/R data obtained from a test in which a blanket SiN film often used as a mask material is etched by the plasma etching apparatus of the present embodiment under the etching conditions same as those used for etching the SiOC film. As can be seen from FIG. 3, an E/R of SiN is considerably lower than an E/R of SiOC, and decreases as an absolute value $|V_{DC}|$ of a negative DC voltage $V_{DC}$ increases.

Figure 5:
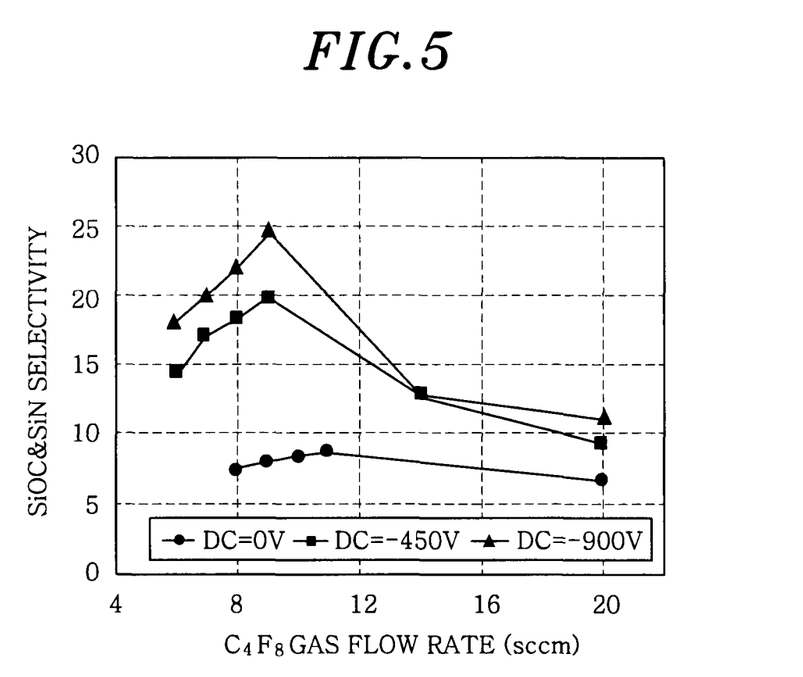
FIG. 5 offers a graph representing a relationship between a flow rate of a $C_4F_8$ gas and an SiOC/SiN selectivity which is obtained in the above embodiment.

FIG. 5 provides a graph depicting SiOC/SiN selectivity obtained, based on the data shown in FIG. 3, from a ratio between an E/R of SiOC and an E/R of SiN with respect to the respective flow rates of $C_4F_8$ used as a fluorocarbon gas. Referring to the graph of FIG. 5, as an absolute value $|V_{DC}|$ of a negative DC voltage $V_{DC}$ increases, the SiOC/SiN selectivity increases. Especially, at the $C_4F_8$ flow rate of about 9 sccm suitable for the E/R control performed by the DC voltage application method of the present embodiment, the selectivity of about 20 is obtained when $V_{DC}$ is about −450 V, and the selectivity of about 25 is obtained when $V_{DC}$ is about −900 V.

Thus, when an SiN layer is used as a resist (mask) in etching an SiOC film, a sufficiently large ratio of an etching rate of a film to be processed to an etching rate of the mask (referred to as mask selectivity hereinafter) can be obtained by selecting a flow rate of a fluorocarbon gas within a proper range or of a proper value and by selecting an absolute value $|V_{DC}|$ of a negative DC voltage $V_{DC}$ greater than or equal to about 450 V (preferably greater than or equal to about 900 V).

When the deposition is enhanced by increasing an absolute value $|V_{DC}|$ of a negative DC voltage $V_{DC}$, the protective film functions effectively on the resist surface as well as on the sidewall of the pattern, the resist tends to become hard, resulting in the increased mask electivity. In other words, the present embodiment is advantageous in that it is possible to realize the anisotropic etching shape and increase the selectivity during the anisotropic etching.

Based on the above observation, the software used in the control unit 80 of the plasma etching apparatus of the present embodiment stores therein a program (hereinafter, referred to as a "DC variable program") for variably controlling a DC voltage $V_{DC}$ in real time in accordance with types, details and conditions of an etching process.

Figure 6:
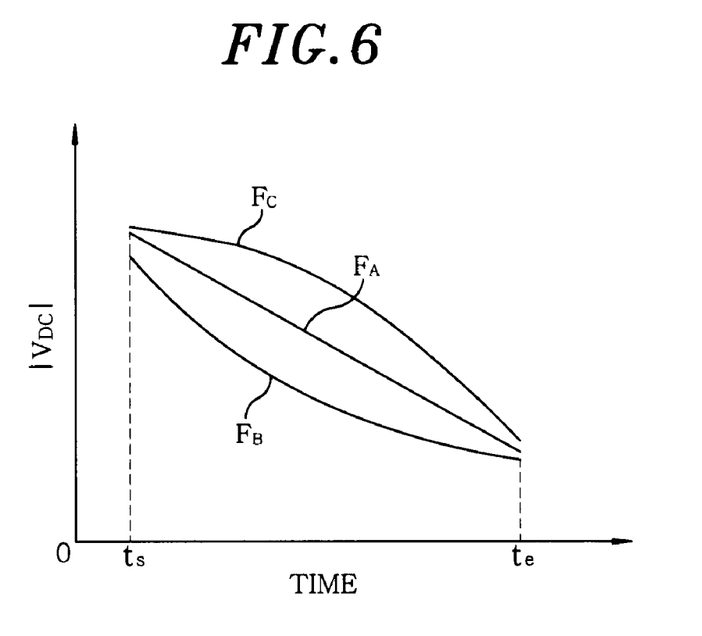
FIG. 6 shows various types of a time-DC voltage functions used in a DC variable program in the above embodiment.

This DC variable program may be prepared for each one-step etching process in which process parameters (RF power supply, pressure, gas species, gas flow rate and the like) except a DC voltage $V_{DC}$ are constantly maintained. For example, as shown in FIG. 6, a time-DC voltage function is set, wherein a horizontal axis indicates an elapsed process time from a start time $t_s$ to a finish time $t_e$ of an one-step etching process, and a vertical axis represents an absolute value $|V_{DC}|$ of a negative DC voltage $V_{DC}$. The time-DC voltage function may be any function such as a first order function $F_A$, a second order function $F_B$, an exponential function $F_C$ or the like, or may be a combination of varying functions in accordance with types, details and conditions of an etching process.

For example, a function for varying an absolute value of a negative DC voltage $V_{DC}$ on a time axis is set so as to cancel out comparative errors between an ideal etching shape and an etching shape obtained by an etching process in which an absolute value of a negative DC voltage $V_{DC}$ is fixed to 0. This function may be used in an actual application.

Figure 7:
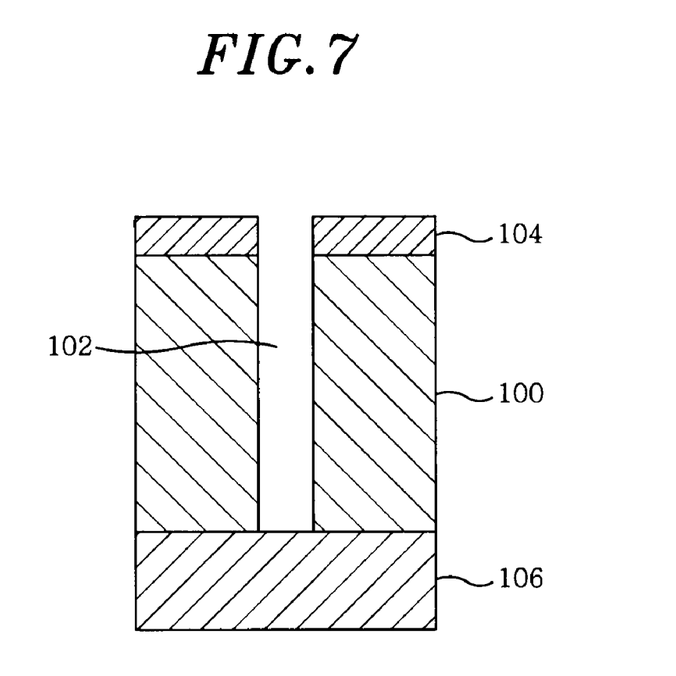
FIG. 7 presents a cross sectional view schematically illustrating an example of a desired etching shape.

For example, as illustrated in FIG. 7, an ideal etching process is to form a strictly vertical contact hole 102 in an insulating film 100. Further, let's assume that there was obtained an etching shape in which a bow shape gradually increases from an opening to a bottom of a contact hole 102 as shown in FIG. 8A or an etching shape in which a bowing was locally generated at an middle portion of the contact hole 102 as shown in FIG. 8B, by carrying out the etching process by using the plasma etching apparatus of the present embodiment while constantly maintaining process parameters required for an one-step etching process and maintaining an absolute value $|V_{DC}|$ of a negative DC voltage $V_{DC}$ at, e.g., 0 V., there was Reference numerals 104 and 106 indicate a resist and a base layer or a base plate, respectively.

Figures 8A, 8B:
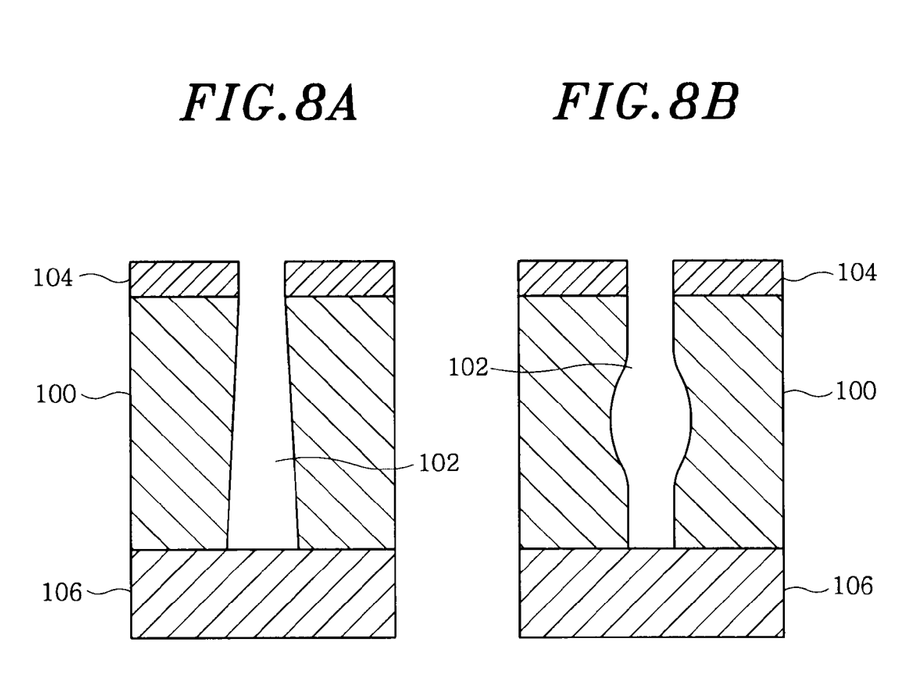
FIGS. 8A and 8B represent a cross sectional view schematically depicting an example of a virtual undesired etching shape obtained when a DC voltage applied to the upper electrode is fixed at 0 V.
Figure 9:
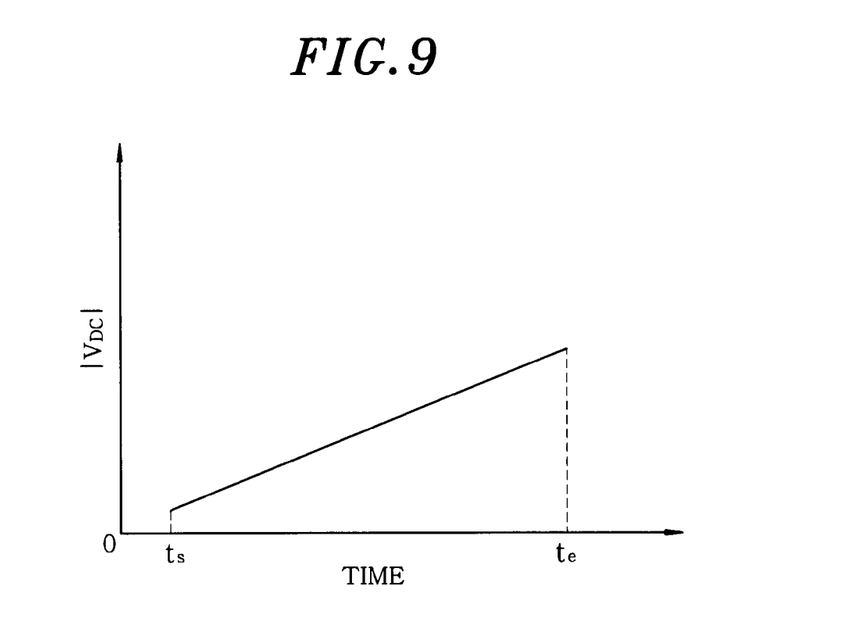
FIG. 9 illustrates an example of a time-DC voltage function suitable for a case shown in FIGS. 8A and 8B.

For case shown in FIG. 8A, a function for linearly increasing the absolute value $|V_{DC}|$ of negative DC voltage $V_{DC}$ over an elapsed time of the etching process, as shown in FIG. 9, may be preferably employed and used therefor.

Figure 10:
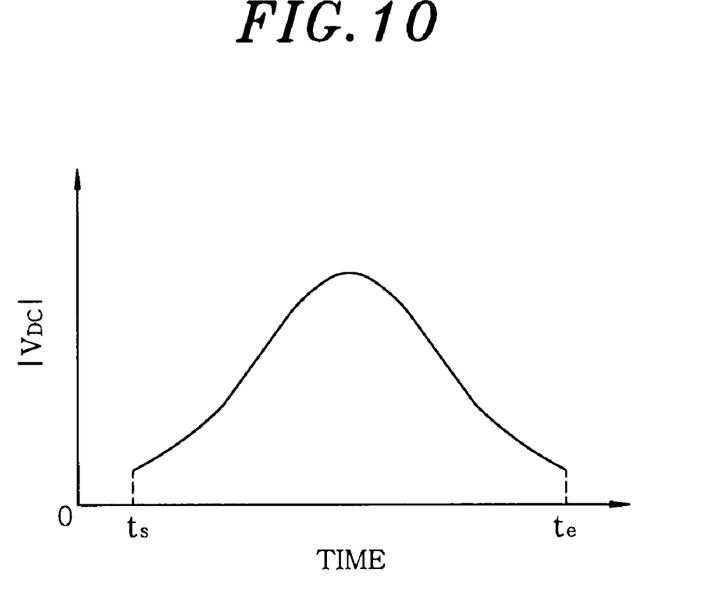
FIG. 10 provides an example of a time-DC voltage function suitable for another case shown in FIGS. 8A and 8B.

As for the case shown in FIG. 8B, a function in which the absolute value $|V_{DC}|$ of negative DC voltage $V_{DC}$ becomes largest, in a mountain shape, in the middle of an elapsed time of the etching process, as depicted in FIG. 10, may be preferably employed and used therefor.

As in the cases shown in FIGS. 8A and 8B, the absolute value $|V_{DC}|$ of negative DC voltage $V_{DC}$ needs to be slightly large to enhance a deposition process at a portion of the pattern where a bowing shape occurs when $|V_{DC}|$ is 0 V. As the extent of the bowing increases, $|V_{DC}|$ needs to be increased further. On the contrary, the absolute value $|V_{DC}|$ of negative DC voltage $V_{DC}$ needs to be slightly reduced in a portion if a tapered shape occurring when $|V_{DC}|$ is 0 V needs to be corrected in a vertical shape.

In the above embodiment, the DC voltage $V_{DC}$ is varied, e.g., continuously, on a time axis in accordance with a predetermined time-DC voltage function so that desired etching characteristics can be obtained from with respect to the film to be processed on the semiconductor wafer W during the one-step etching process in which process parameters other than the DC voltage $V_{DC}$ are constantly maintained.

Figure 11:
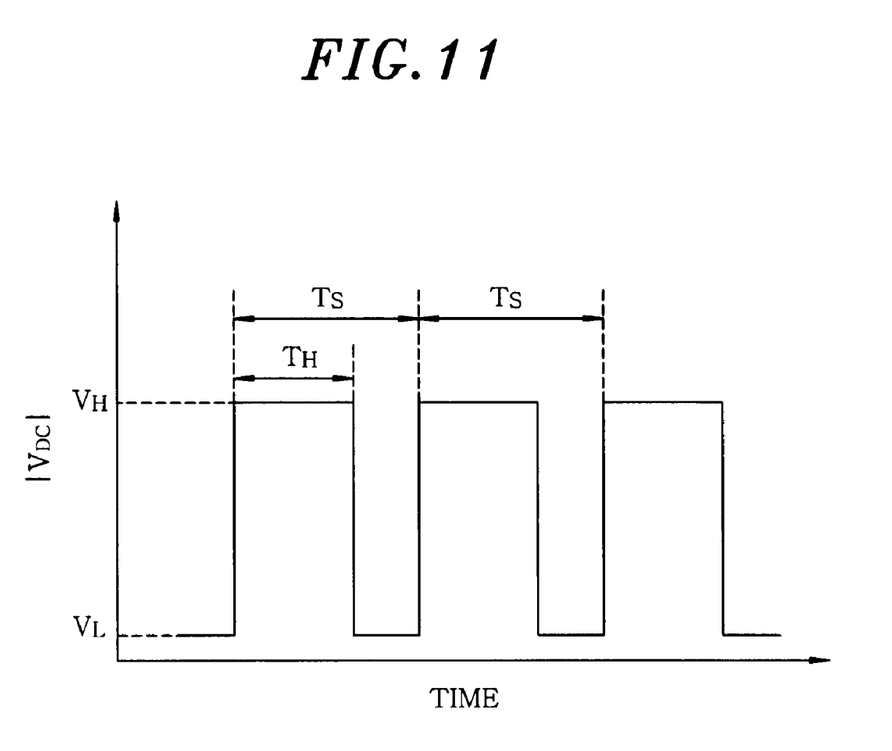
FIG. 11 is a waveform diagram illustrating a type in which a DC voltage is switched between a first voltage value and a second voltage value at regular cycles on a time axis in the above embodiment.

A further embodiment of the present invention may employ another method shown in FIG. 11 in which the absolute value $|V_{DC}|$ of a negative DC voltage $V_{DC}$ is switched between a first voltage value $V_H$ and a second voltage value $V_I$ ($V_H > V_I$) in each of regular cycles $T_S$, instead of varying, e.g., continuously, the absolute value $|V_{DC}|$ of negative DC voltage $V_{DC}$ on a time axis. In this method, a duty ($100 \times T_H/T_S$) of each cycle $T_S$ may vary in accordance with a preset time-duty function so that desired etching characteristics can be obtained with respect to the film to be processed on the surface of the semiconductor wafer W. Basically, the duty may be regarded as being proportional to $|V_{DC}|$, and the time-duty function may be set to correspond to those shown in FIGS. 6, 9 and 10. In this duty variation type, as for a DC power supply for applying a DC voltage $V_{DC}$ to the upper electrode 60, a constant voltage source for outputting a constant voltage (e.g., −900 V) may be used instead of the variable DC power supply 74. In that case, the second voltage value $V_L$ may be set as the ground potential (0 V).

In the one-step etching process of the embodiments of the present invention, it is necessary to constantly maintain at least parameters related to the etching gas such as gas species and gas flow rate, and other process parameters (e.g., a RF power, a pressure and the like) may vary during the processing.

Moreover, the film to be processed in the one-step etching processes of the embodiments is not limited to a single layer film, and may also be a multilayer film (e.g., a double-layer film of TEOS and SOG).

In the above embodiments, the DC voltage $V_{DC}$ is applied to the upper electrode 60. However, although it is not shown, the DC voltage $V_{DC}$ may also be applied to, e.g., the focus ring 38 in order to obtain the same effect. In that case, the focus ring 38 may be preferably made of a Si-containing conductive material such as Si, SiC or the like.

In the above embodiment, the present invention is applied to an etching process using a DC voltage application member containing silicon and an etching gas containing a fluorocarbon gas. However, the present invention may also be applied to an application using an etchant gas other than a fluorocarbon gas. In that case, the DC voltage application member may be made of a material that is etched by reactant species of the corresponding etchant gas.

Although the DC voltage $V_{DC}$ of the present invention preferably has a negative value ($\leqq 0$ V), the DC voltage $V_{DC}$ may have a positive value ($\geqq 0$ V) if necessary.

Figure 12:
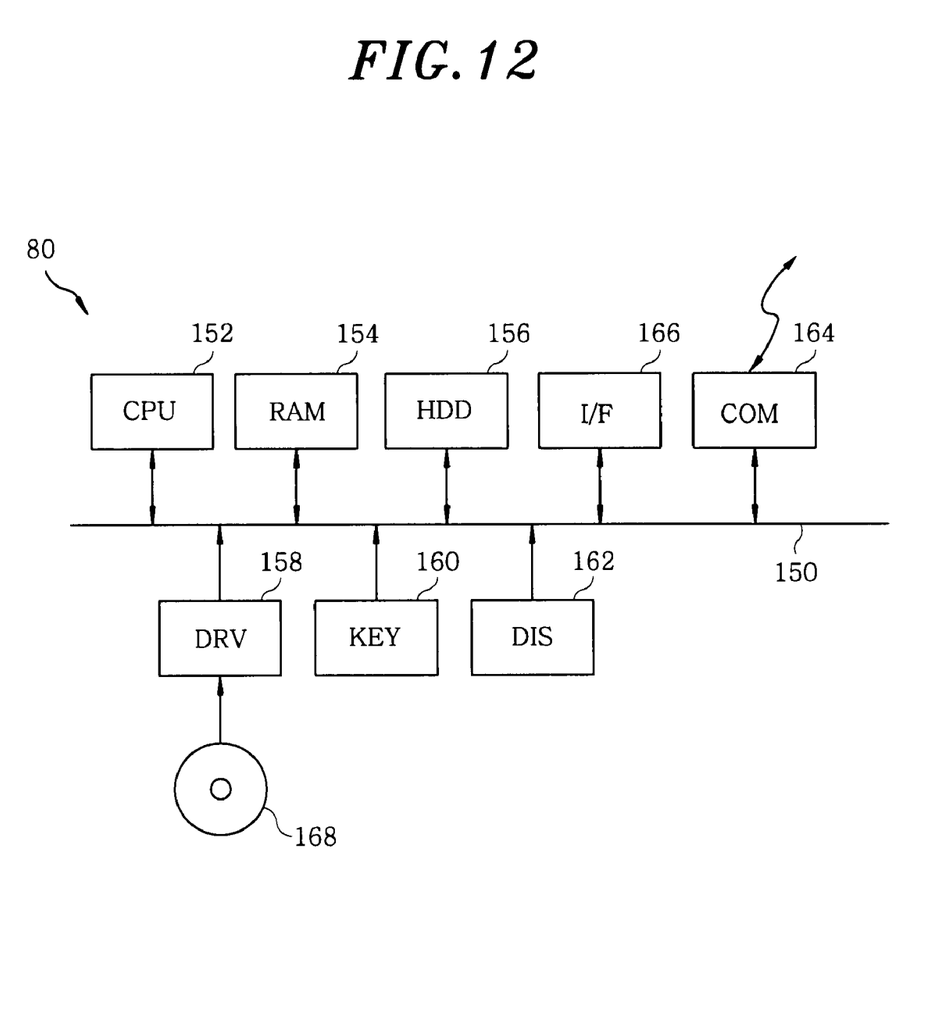
FIG. 12 offers a block diagram showing a configuration example of a control unit in the above embodiment.

FIG. 12 depicts a configuration example of the control unit 80 for controlling an entire sequence and an operation of each unit in the plasma processing apparatus (see FIG. 1) for performing the plasma etching method of the above embodiment.

The control unit 80 of the configuration example includes a processor (CPU) 152 connected thereto via a bus 150, a memory (RAM) 154, a program storage unit (HDD) 156, a disk drive (DRV) 158 such as a floppy drive, an optical disk or the like, an input device (KEY) 160 such as a keyboard, a mouse or the like, a display device (DIS) 162, a network interface (COM) 164 and a peripheral interface (I/F) 166.

The processor (CPU) 152 reads a code of a required program from the storage medium 168 such as a floppy disk (FD), an optical disk or the like installed in the disk drive (DRV) 158, and stores the read code in the HDD 156. Or, a required program may be downloaded from a network via the network interface 164. Further, the processor (CPU) 152 loads a program required to each step or each moment from the HDD 156 into the working memory (RAM) and performs each step of the program while processing required operation so that each unit in the apparatus (especially, the gas exhaust unit 26, the radio wave power supplies 30 and 32, the processing gas supply unit 70, the variable DC power supply 74, the on/off switch 76 and the like) is controlled via the peripheral interface 166. The program for performing the plasma etching method of the above embodiment is executed in this computer system.

A capacitively coupled plasma etching apparatus used in the present invention is not limited to the lower electrode dual frequency application type of the above embodiments, and may also be applied to, e.g. a type that a single radio wave is applied to a susceptor (lower electrode), a type that a single radio wave is applied to an upper electrode, or the like.

A substrate to be processed in the present invention is not limited to a semiconductor wafer, and may be selected from various substrates for use in a flat panel display, a photomask, a CD substrate, a printed circuit board, and the like.

In accordance with the plasma etching method or the computer readable storage medium, due to the aforementioned configurations and operations, a desired etching shape can be controlled accurately by using a capacitively coupled plasma etching apparatus.

While the invention has been shown and described with respect to the embodiments, it will be understood by those skilled in the art that various changes and modification may be made without departing from the scope of the invention as defined in the following claims.

What is claimed is:

1. A plasma etching method comprising:
   disposing a first electrode and a second electrode to face each other in parallel with a gap therebetween in a vacuum evacuable processing chamber;
   preparing a part in the processing chamber;
   supporting a substrate to be processed by the second electrode to face the first electrode;
   vacuum-evacuating the processing chamber to a predetermined pressure;
   supplying an etching gas into a processing space between the first electrode and the second electrode;
   generating a plasma of the etching gas in the processing space by applying a radio wave power to the first electrode or the second electrode; and
   etching a film to be processed on a surface of the substrate by using the plasma, wherein a DC voltage is applied to the part during a predetermined etching process, the part being disposed away from the substrate and being etched by reaction with reactant species in the plasma, and
   wherein the DC voltage is varied on a time axis in accordance with a preset time-voltage function to thereby obtain desired etching characteristics with respect to the film, during the etching process, at least process parameters related to the etching gas are not varied.

2. The plasma etching method of claim 1, wherein throughout the etching process, only the etching gas of a single species is supplied and all process parameters related to the etching gas are not varied.

3. The plasma etching method of claim 1, wherein all process parameters except the DC voltage are not varied throughout the etching process.

4. The plasma etching method of claim 1, wherein the DC voltage varies within a negative value range, and an absolute value of the DC voltage decreases when an etching rate of the film is required to be increased, and increases when the etching rate of the film is required to be decreased during the etching process.

5. The plasma etching method of claim 1, wherein the DC voltage varies within a negative value range, and an absolute value of the DC voltage increases when a deposition with respect to the film is required to be enhanced, and decreases when the deposition with respect to the film is required to be decreased during the etching process.

6. The plasma etching method of claim 1, wherein the part to which the DC voltage is applied is the first electrode.

7. The plasma etching method of claim 1, wherein the part to which the DC voltage is applied is a focus ring disposed on the second electrode to surround the substrate annularly.

8. The plasma etching method of claim 1, wherein the part contains silicon, and the etching gas contains a fluorocarbon gas.

9. The plasma etching method of claim 1, wherein an additional radio wave power for attracting ions in the plasma to the substrate is applied to the second electrode.

10. A non-transitory computer readable storage medium storing therein a control program operating on a computer, wherein the control program, when executed, controls a plasma processing apparatus to perform the plasma etching method described in claim 1.

11. A plasma etching method comprising:
disposing a first electrode and a second electrode to face each other in parallel with a predetermined gap therebetween in a vacuum evacuable processing chamber;
preparing a part in the processing chamber;
supporting a substrate to be processed by the second electrode to face the first electrode;
vacuum-evacuating the processing chamber to a predetermined pressure;
supplying an etching gas into a processing space between the first electrode and the second electrode;
generating a plasma of the etching gas in the processing space by applying a radio wave power to the first electrode or the second electrode; and
etching a film to be processed on a surface of the substrate by using the plasma,
wherein a DC voltage is applied to the part during a predetermined etching process, the part being disposed away from the substrate and being etched by reaction with reactant species in the plasma, and
wherein the DC voltage is switched between a first voltage value and a second voltage value on a time axis in each of regular cycles in accordance with a preset time-duty function to thereby obtain desired etching characteristics with respect to the film and, during the etching process, at least process parameters related to the etching gas are not varied.

12. The plasma etching method of claim 11, wherein throughout the etching process, only the etching gas of a single species is supplied and all process parameters related to the etching gas are not varied.

13. The plasma etching method of claim 11, wherein all process parameters except the DC voltage are not varied throughout the etching process.

14. The plasma etching method of claim 11, wherein the first and the second voltage value have negative values; an absolute value of the first voltage value is larger than an absolute value of the second voltage value; and during the etching process, a duty of a period at which the DC voltage has the first voltage value is decreased when an etching rate for the film is required to be increased, whereas the duty of the period at which the DC voltage has the first voltage value is increased when the etching rate for the film is required to be decreased.

15. The plasma etching method of claim 11, wherein the first and the second voltage value have negative values; an absolute value of the first voltage value is larger than an absolute value of the second voltage value; and during said etching film, a duty of a period at which the DC voltage has the first voltage value is increased when a deposition with respect to the film is required to be enhanced, whereas the duty of the period at which the DC voltage has the first voltage value is decreased when the deposition with respect to the film is required to be decreased.

16. The plasma etching method of claim 11, wherein the part to which the DC voltage is applied is the first electrode.

17. The plasma etching method of claim 11, wherein the part to which the DC voltage is applied is a focus ring disposed on the second electrode to surround the substrate annularly.

18. The plasma etching method of claim 11, wherein the part contains silicon, and the etching gas contains a fluorocarbon gas.

19. The plasma etching method of claim 11, wherein an additional radio wave power for attracting ions in the plasma to the substrate is applied to the second electrode.

20. A non-transitory computer readable storage medium storing therein a control program operating on a computer, wherein the control program, when executed, controls a plasma processing apparatus to perform the plasma etching method described in claim 11.

* * * * *